(12) United States Patent
Kawashiro

(10) Patent No.: US 11,264,348 B2
(45) Date of Patent: Mar. 1, 2022

(54) SEMICONDUCTOR DEVICE HAVING AN ULTRASONIC BONDING PORTION PROVIDED BETWEEN A SUBSTRATE AND A SEMICONDUCTOR CHIP

(71) Applicants: Kabushiki Kaisha Toshiba, Tokyo (JP); Toshiba Electronic Devices & Storage Corporation, Tokyo (JP)

(72) Inventor: Fumiyoshi Kawashiro, Tokyo (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 0 days.

(21) Appl. No.: 16/775,423

(22) Filed: Jan. 29, 2020

(65) Prior Publication Data
US 2021/0074666 A1   Mar. 11, 2021

(30) Foreign Application Priority Data
Sep. 5, 2019   (JP) .............................. JP2019-161843

(51) Int. Cl.
*H01L 23/00*  (2006.01)
*B06B 3/00*   (2006.01)

(52) U.S. Cl.
CPC .............. *H01L 24/29* (2013.01); *B06B 3/00* (2013.01); *H01L 2924/0635* (2013.01); *H01L 2924/13055* (2013.01); *H01L 2924/13091* (2013.01)

(58) Field of Classification Search
CPC . H01L 2224/72365; H01L 2224/48247; H01L 2224/48227; H01L 2224/85205; H01L 2224/84205; H01L 2224/83205; H01L 2224/8385; H01L 2224/8485; H01L 2924/13055; H01L 2924/13091;
(Continued)

(56) References Cited

U.S. PATENT DOCUMENTS 5,621,243 A * 4/1997 Baba .................. H01L 23/3735
257/712
6,060,772 A * 5/2000 Sugawara ............. H01L 25/162
257/678
(Continued)

FOREIGN PATENT DOCUMENTS

| JP | S62-156896 A | 7/1987 |
| JP | 4371151 B2 | 11/2009 |
| JP | 2013-89784 A | 5/2013 |

OTHER PUBLICATIONS

David Guillon, et al., "Particle prevention during ultrasonic welding process," PCIM Europe 2018, pp. 1468-1474, Jun. 5-7, 2018, Nuremberg, Germany.

*Primary Examiner* — Khiem D Nguyen
(74) *Attorney, Agent, or Firm* — Allen & Overy LLP

(57) ABSTRACT

A semiconductor device of embodiments includes a substrate; a semiconductor chip provided above the substrate; a first ultrasonic bonding portion provided between the substrate and the semiconductor chip; a first terminal plate electrically connected to the semiconductor chip via the first ultrasonic bonding portion, the first ultrasonic bonding portion being provided on the substrate, and the first terminal plate having a first surface facing the semiconductor chip; and a first adhesive layer provided on the first surface, and the first adhesive layer containing a first adhesive.

13 Claims, 6 Drawing Sheets

(58) Field of Classification Search
CPC ... H01L 2924/1305; H01L 2224/73265; H01L 24/06; H01L 24/24; H01L 24/29; H01L 24/32; H01L 24/45; H01L 24/48; H01L 24/73; H01L 23/3672; H01L 23/49568; H01L 24/83; B06B 3/00
USPC .......................................................... 257/783
See application file for complete search history.

(56) References Cited

U.S. PATENT DOCUMENTS

| | | | | |
|---|---|---|---|---|
| 6,605,868 | B2* | 8/2003 | Ishiwata | H05K 1/0256 |
| | | | | 257/703 |
| 7,482,685 | B2* | 1/2009 | Fukuda | H01L 23/053 |
| | | | | 257/703 |
| 9,029,994 | B2* | 5/2015 | Ueda | H01L 23/3121 |
| | | | | 257/678 |
| 9,698,091 | B2* | 7/2017 | Asada | H01L 24/37 |
| 10,468,387 | B2* | 11/2019 | Takahashi | H01L 29/49 |
| 2010/0065962 | A1* | 3/2010 | Bayerer | H05K 3/44 |
| | | | | 257/703 |
| 2010/0096758 | A1* | 4/2010 | Yamada | H01L 24/49 |
| | | | | 257/773 |
| 2013/0137218 | A1* | 5/2013 | Morita | C08K 5/32 |
| | | | | 438/113 |
| 2015/0214183 | A1* | 7/2015 | Inoue | H01L 24/29 |
| | | | | 257/762 |
| 2016/0126154 | A1* | 5/2016 | Hoehn | H01L 21/4853 |
| | | | | 257/693 |
| 2016/0233202 | A1* | 8/2016 | Komo | H01L 23/3736 |
| 2016/0336268 | A1* | 11/2016 | Kamikura | H01L 23/3121 |
| 2018/0247888 | A1* | 8/2018 | Oya | H01L 23/053 |

* cited by examiner

SEMICONDUCTOR DEVICE HAVING AN ULTRASONIC BONDING PORTION PROVIDED BETWEEN A SUBSTRATE AND A SEMICONDUCTOR CHIP

CROSS-REFERENCE TO RELATED APPLICATION

This application is based upon and claims the benefit of priority from Japanese Patent Application No. 2019-161843, filed on Sep. 5, 2019, the entire contents of which are incorporated herein by reference.

FIELD

Embodiments described herein relate generally to Semiconductor Device.

Development of power semiconductor chips such as metal-oxide-semiconductor field-effect-transistors (MOSFETs) and insulated gate bipolar transistors (IGBTs) designed for power control aimed at a wide range of fields of power generation and transmission, rotating machines such as pumps and blowers, power supply devices of communication systems, factories or the like, railway using AC motors, electric vehicles, consumer electronics products and the like has been performed.

Moreover, a semiconductor device as a power module using such a power semiconductor chip has been developed. Specifications of a high current density, low loss, high heat dissipation, and the like have been required for such a semiconductor device.

DETAILED DESCRIPTION

Figure 1:
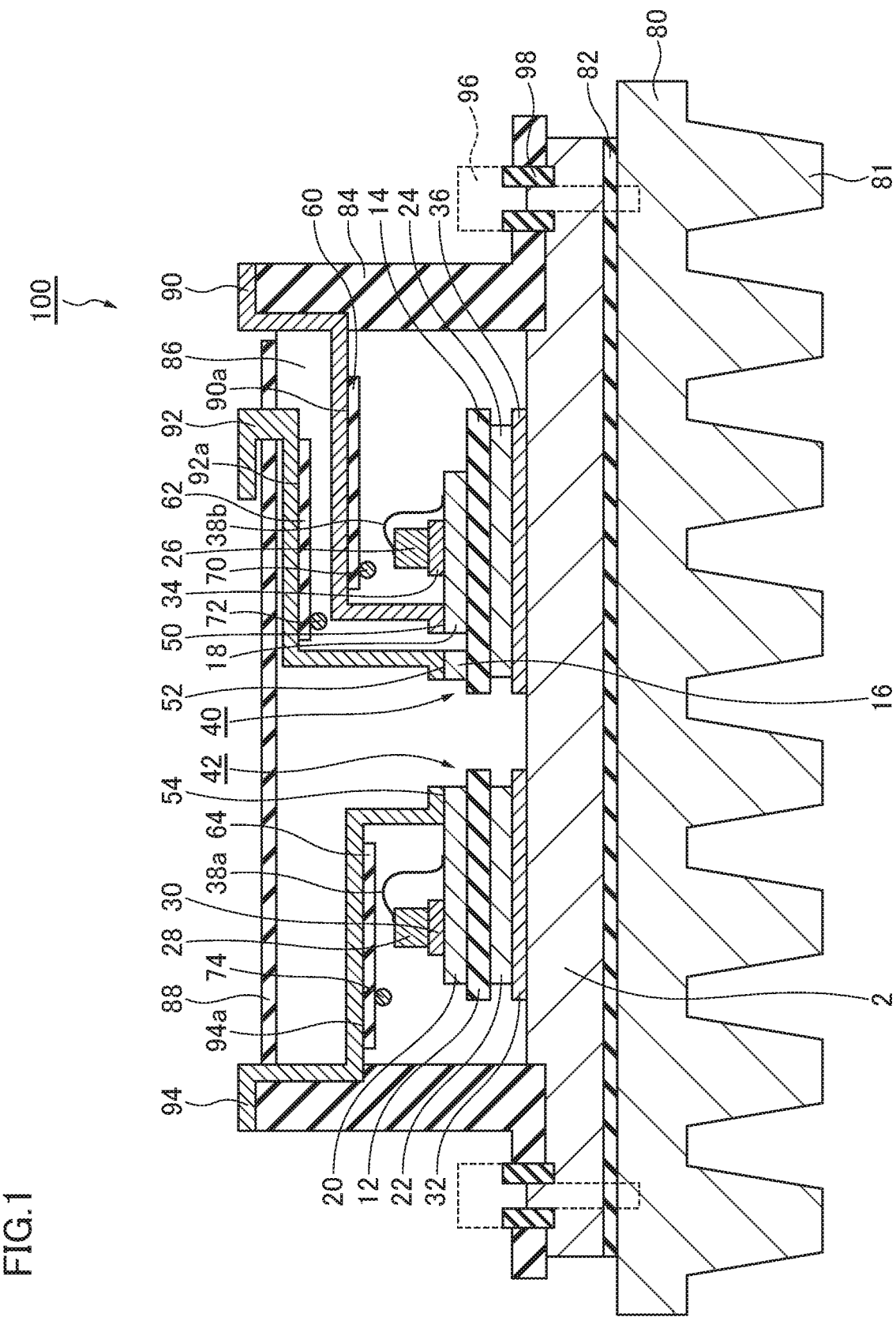
FIG. 1 is a schematic cross-sectional view of a semiconductor device of a first embodiment.

Hereinafter, embodiments will be described with reference to the accompanying drawings. In addition, in the following description, in some cases, the same or similar members are denoted by the same reference numerals. In addition, in some cases, description of the once-described member or the like is omitted as appropriate.

Herein, in the specification, in order to illustrate positional relationship of components and the like, the upward direction of the drawing is denoted by "upper", and the downward direction of the drawing is denoted by "lower". In the specification, the concept of the "upper" and the "lower" are not necessarily terms indicating the relationship based on the direction of gravity.

First Embodiment

A semiconductor device of this embodiment includes a substrate, a semiconductor chip provided above the substrate, a first ultrasonic bonding portion provided between the substrate and the semiconductor chip, a first terminal plate electrically connected to the semiconductor chip via the first ultrasonic bonding portion, the first ultrasonic bonding portion being provided on the substrate, and the first terminal plate having a first surface facing the semiconductor chip, a first adhesive layer provided on the first surface, and the first adhesive layer containing a first adhesive.

FIG. 1 is a schematic cross-sectional view of a semiconductor device 100 of this embodiment.

The semiconductor device 100 includes a base material 2, a first insulating plate 12, a second insulating plate 14, a first metal plate 16, a second metal plate 18, a third metal plate 20, a fourth metal plate 22, a fifth metal plate 24, a first semiconductor chip 26, a second semiconductor chip 28, a first bonding material 30, a second bonding material 32, a third bonding material 34, a fourth bonding material 36, a bonding wire 38a, a bonding wire 38b, a first ultrasonic bonding portion 50, a second ultrasonic bonding portion 52, a third ultrasonic bonding portion 54, a first adhesive layer 60, a second adhesive layer 62, a third adhesive layer 64, a first metal piece 70, a second metal piece 72, a third metal piece 74, a heat dissipation plate 80, a thermal interface material (TMI) 82, a casing 84, a sealing material (gel) 86, a lid 88, a first terminal plate 90, a second terminal plate 92, a third terminal plate 94, a screw 96, and a washer 98.

The heat dissipation plate 80 has fins 81 in the lower portion. The heat dissipation plate 80 is used to dissipate heat generated from the semiconductor chip and the like to be described later.

The base material 2 is provided above the heat dissipation plate 80. The base material 2 is made of a metal such as Cu (copper) or Al (aluminum). In addition, the base material 2 may be made of a Cu-based alloy, an Al-based alloy, or other alloys. In addition, the base material 2 may be a material obtained by plating the surface of, for example, a Cu plate member with Ni (nickel) or the like.

A first substrate 40 (an example of the substrate) includes the fifth metal plate 24, the second insulating plate 14, the first metal plate 16, and the second metal plate 18.

The fifth metal plate 24 is bonded above the base material 2 by using, for example, the fourth bonding material 36. The second insulating plate 14 is provided on the fifth metal plate 24. The first metal plate 16 and the second metal plate 18 are provided on the second insulating plate 14.

A second substrate 42 includes the fourth metal plate 22, the first insulating plate 12, and the third metal plate 20.

The fourth metal plate 22 is bonded above the base material 2 by using, for example, the second bonding material 32. The first insulating plate 12 is provided on the fourth metal plate 22. The third metal plate 20 is provided on the first insulating plate 12.

The first insulating plate 12 and the second insulating plate 14 are plate members made of, for example, AlN (aluminum nitride), SiN (silicon nitride), $Al_2O_3$ (aluminum oxide (alumina)), or the like.

The first metal plate 16, the second metal plate 18, the third metal plate 20, the fourth metal plate 22, and the fifth metal plate 24 are metal plates made of, for example, Cu (copper) and are used as circuit wiring. For example, the third metal plate 20 and the fourth metal plate 22 are bonded to a surface of the first insulating plate 12 by using a brazing material or the like (not illustrated). The third metal plate 20 is bonded to one surface of the first insulating plate 12. The fourth metal plate 22 is bonded to the other surface of the first insulating plate 12. For example, the first metal plate 16, the second metal plate 18, and the fifth metal plate 24 are bonded to the surface of the second insulating plate 14 by using a brazing material or the like (not illustrated). For example, the first metal plate 16 and the second metal plate 18 are bonded to one surface of the second insulating plate 14. The fifth metal plate 24 is bonded to the other surface of the second insulating plate 14.

Figure 2A:
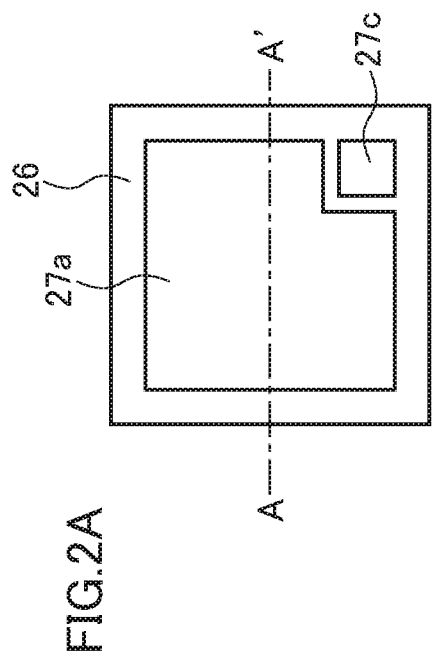
FIGS. 2A to 2D are schematic views of a first semiconductor chip and a second semiconductor chip of the first embodiment.
Figure 2B:
Figure 2C:
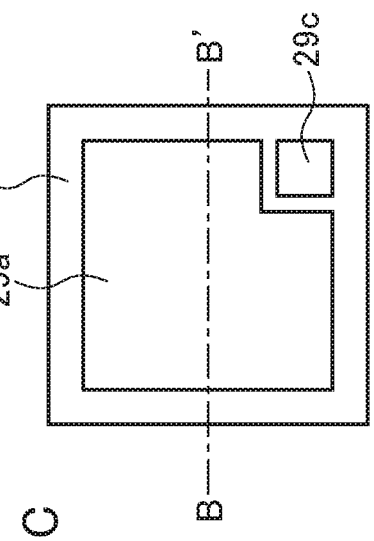
Figure 2D:
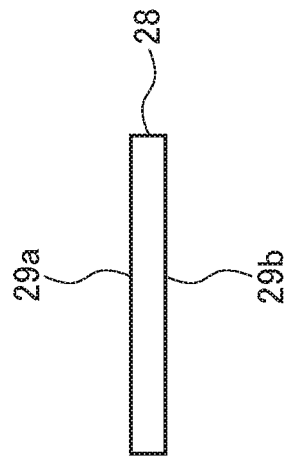

FIGS. 2A to 2D are schematic views of the first semiconductor chip 26 (an example of the semiconductor chip) and the second semiconductor chip 28 of this embodiment. FIG. 2A is a schematic top view of the first semiconductor chip 26 of this embodiment. FIG. 2B is a schematic cross-sectional view of the first semiconductor chip 26 of this embodiment in a cross section A-A' of FIG. 2A. FIG. 2C is a schematic top view of the second semiconductor chip 28 of this embodiment. FIG. 2D is a schematic cross-sectional view of the second semiconductor chip 28 of this embodiment in a cross section B-B' in FIG. 2C.

Each of the first semiconductor chip 26 and the second semiconductor chip 28 is, for example, an Si-IGBT with Si (silicon). The first semiconductor chip 26 has a first emitter electrode 27a (an example of a first electrode), a first collector electrode 27b (an example of a second electrode), and a first gate electrode 27c (an example of a first control electrode). For example, the first emitter electrode 27a and the first gate electrode 27c are provided on the upper surface of the first semiconductor chip 26, and the first collector electrode 27b is provided on the lower surface of the first semiconductor chip 26. The second semiconductor chip 28 has a second emitter electrode 29a, a second collector electrode 29b, and a second gate electrode 29c. For example, the second emitter electrode 29a and the second gate electrode 29c are provided on the upper surface of the second semiconductor chip 28, and the second collector electrode 29b is provided on the lower surface of the second semiconductor chip 28.

In addition, the first semiconductor chip 26 and the second semiconductor chip 28 may be Si-MOSFETs, Si-fast recovery diodes (Si-FRDs), SiC-IGBTs, SiC-MOSFETs, or SiC-Schottky barrier diodes (SiC-SBDs) using SiC (silicon carbide), GaN-MOSFETs using a nitride semiconductor where a group V element is nitrogen in a group III-V semiconductor, or the like.

In FIG. 1, the first semiconductor chip 26 is bonded above the second metal plate 18 by using, for example, the third bonding material 34. The bonding wire 38b is provided on the first semiconductor chip 26 and the second metal plate 18. Then, the bonding wire 38b electrically connects the first emitter electrode 27a, the first collector electrode 27b, or the first gate electrode 27c and the second metal plate 18. The bonding wire 38b is made of, for example, Al (aluminum) and, thus, contains Al.

In FIG. 1, the second semiconductor chip 28 is bonded above the third metal plate 20 by using, for example, the first bonding material 30. The bonding wire 38a is provided on the second semiconductor chip 28 and the third metal plate 20. Then, the bonding wire 38a electrically connects the second emitter electrode 29a, the second collector electrode 29b, or the second gate electrode 29c and the third metal plate 20. The bonding wire 38a is made of, for example, Al (aluminum) and, thus, contains Al.

The first bonding material 30, the second bonding material 32, the third bonding material 34, and the fourth bonding material 36 are, for example, solder. As the first bonding material 30, the second bonding material 32, the third bonding material 34, and the fourth bonding material 36, for example, a solder using Pb (lead), Ag (silver), or Sn (tin), having a composition of $Pb_{95}Sn_5$, $Pb_{95}Ag_{1.5}Sn_{3.5}$, or the like, and having a melting point of about 330° C., a solder using Sn and Sb (antimony), having an SnSb-based composition, and having a melting point of about 240° C., an AuSn-based solder using Au (gold) and Sn and having a melting point of about 280° C., an AuSi-based solder using Au and Si and having a melting point of about 360° C., and a AuGe-based solder using Au and Ge (germanium) and having a melting point of about 360° C. can be used as appropriate. The first bonding material 30, the second bonding material 32, the third bonding material 34, and the fourth bonding material 36 are not limited to the solder described above, but these bonding materials may be, for example, other sintered materials, or the like.

The number of semiconductor chips included in the semiconductor device 100 is two as described above, that is, the semiconductor chips are the first semiconductor chip 26 and the second semiconductor chip 28. However, the number of semiconductor chips is not limited thereto. For example, the number of semiconductor chips included in the semiconductor device 100 may be 50 or more.

The casing 84 is made of, for example, a resin, and is provided, for example, on the base material 2 so as to surround the first semiconductor chip 26 and the second semiconductor chip 28. The casing 84 is fixed on the base material 2 by using the screws 96 and the washers 98. A known sealing material (gel) 86 is inserted into the casing 84 and sealed. The lid 88 is disposed on top of the sealing material 86 (gel).

The thermal interface material (TMI) 82 is provided between the base material 2 and the heat dissipation plate 80. The thermal interface material 82 is, for example, a grease-like member. The thermal interface material 82 is applied on the heat dissipation plate 80. Then, the base material 2 is disposed on the thermal interface material 82 to be in contact with the thermal interface material 82. The thermal interface material 82 buries small gaps or irregularities between the base material 2 and the heat dissipation plate 80 to efficiently transfer the heat generated in the first semiconductor chip 26 and the second semiconductor chip 28 to the heat dissipation plate 80.

One end of the first terminal plate 90 is connected on the second metal plate 18 by using the first ultrasonic bonding portion 50 formed by an ultrasonic bonding method. Then, one end of the first terminal plate 90 is electrically connected to the first emitter electrode 27a, the first collector electrode 27b, or the first gate electrode 27c of the first semiconductor chip 26 via the first ultrasonic bonding portion 50.

The first terminal plate 90 has a first surface 90a facing the first semiconductor chip 26. Then, the other end of the first terminal plate 90 is provided outside the casing 84.

One end of the second terminal plate 92 is bonded on the first metal plate 16 by using the second ultrasonic bonding portion 52 formed by the ultrasonic bonding method. Then, one end of the second terminal plate 92 is electrically connected to the first emitter electrode 27a, the first collector electrode 27b, or the first gate electrode 27c of the first semiconductor chip 26 via the second ultrasonic bonding portion 52.

The second terminal plate 92 is provided on the first terminal plate 90 and has a second surface 92a facing the first terminal plate 90. Then, the other end of the second terminal plate 92 is provided outside the casing 84.

One end of the third terminal plate 94 is connected on the third metal plate 20 by using the third ultrasonic bonding portion 54 formed by the ultrasonic bonding method. Then, one end of the third terminal plate 94 is electrically connected to the second emitter electrode 29a, the second collector electrode 29*b*, or the second gate electrode 29*c* of the second semiconductor chip 28 via the third ultrasonic bonding portion 54.

The third terminal plate 94 has a third surface 94*a* facing the second semiconductor chip 28. Then, the other end of the third terminal plate 94 is provided outside the casing 84.

The first terminal plate 90, the second terminal plate 92, and the third terminal plate 94 are formed as integral parts by molding Cu plates having a thickness of, for example, about 1 mm or more and 1.5 mm or less by using, for example, a metal plate, and this is preferable because the terminal plates can be easily produced. However, the manufacturing method of the first terminal plate 90, the second terminal plate 92, and the third terminal plate 94 is not limited thereto.

The first ultrasonic bonding portion 50 contains a metal material contained in the first terminal plate 90 and the second metal plate 18. For example, in a case where the first terminal plate 90 and the second metal plate 18 are made of Cu, the first ultrasonic bonding portion 50 contains Cu.

The second ultrasonic bonding portion 52 contains a metal material contained in the second terminal plate 92 and the first metal plate 16. For example, in a case where the second terminal plate 92 and the first metal plate 16 are made of Cu, the second ultrasonic bonding portion 52 contains Cu.

The third ultrasonic bonding portion 54 contains a metal material contained in the third terminal plate 94 and the third metal plate 20. For example, in a case where the third terminal plate 94 and the third metal plate 20 are made of Cu, the third ultrasonic bonding portion 54 contains Cu.

Figure 3:
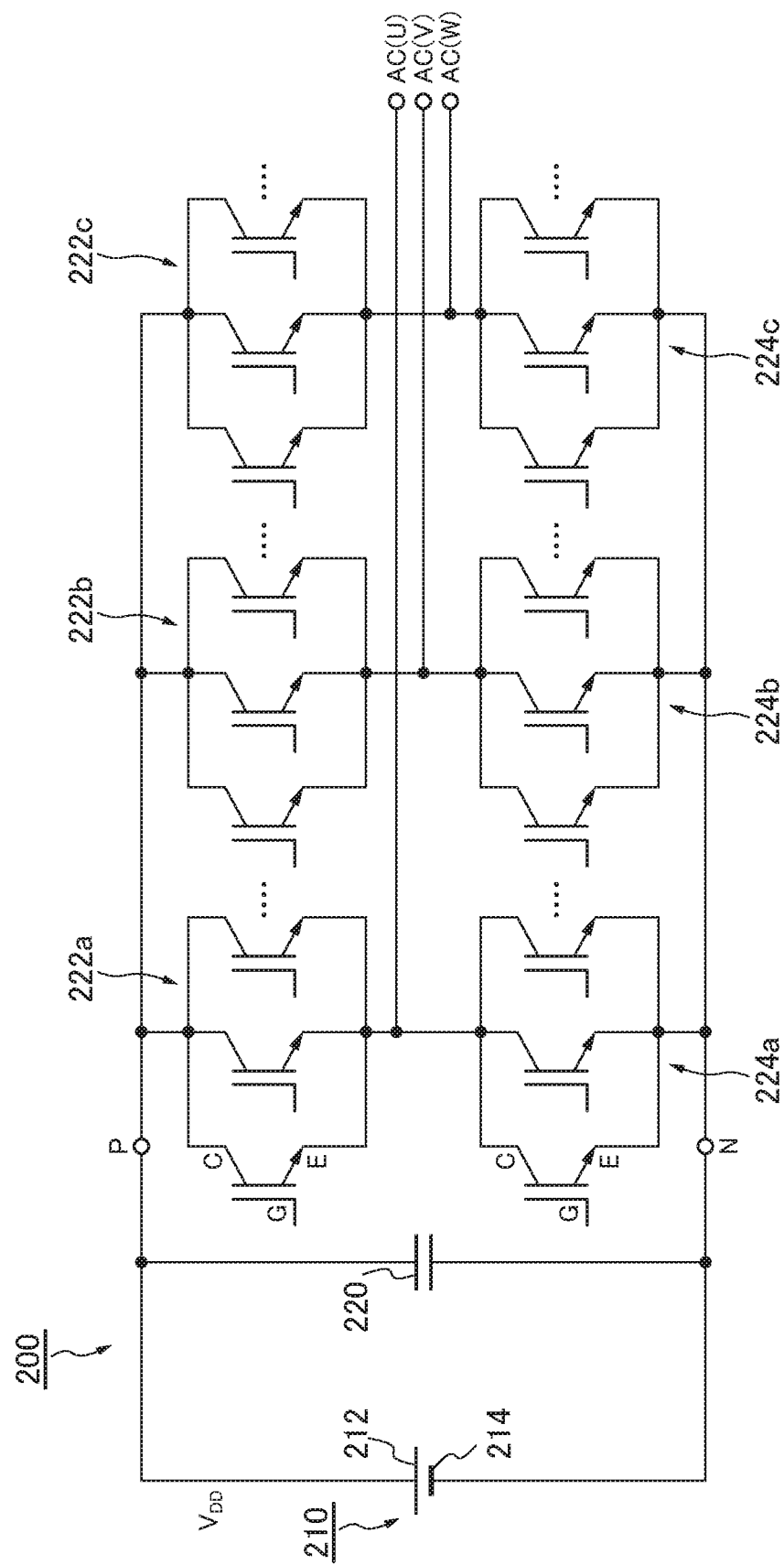
FIG. 3 is a schematic circuit diagram of a power conversion device of the first embodiment.

FIG. 3 is a schematic circuit diagram of a power conversion device 200 of this embodiment. The power conversion device 200 of the embodiment is an inverter circuit. Then, the semiconductor device 100 of the embodiment is used as a portion of the power conversion device 200 or the power conversion device 200.

The power conversion device 200 includes a plurality of high-side transistors 222*a*, 222*b*, and 222*c* connected in parallel with each other and a plurality of low-side transistors 224*a*, 224*b*, and 224*c* connected in parallel with each other. Then, the high-side transistor 222*a* and the low-side transistor 224*a* are connected in series. Similarly, the high-side transistor 222*b* and the low-side transistor 224*b* are connected in series, and the high-side transistor 222*c* and the low-side transistor 224*c* are connected in series.

The high-side transistors 222*a*, 222*b*, and 222*c* and the low-side-transistors 224*a*, 224*b*, and 224*c* are, for example, IGBTs, but may be MOSFETs or the like. In addition, the number of high-side transistors 222*a*, 222*b*, and 222*c* and the number of low-side-transistors 224*a*, 224*b*, and 224*c* are not particularly limited. The first semiconductor chip 26 or the second semiconductor chip 28 is used as each of the high-side-transistors 222*a*, 222*b*, and 222*c* and the low-side-transistors 224*a*, 224*b*, and 224*c*.

A positive electrode 212 of a DC power supply 210 and one end of a smoothing capacitor 220 are connected to the high-side-transistors 222*a*, 222*b*, and 222*c* via a positive terminal P. A negative electrode 214 of the DC power supply 210 and the other end of the smoothing capacitor 220 are connected to the low-side-transistors 224*a*, 224*b*, and 224*c* via a negative terminal N.

An output terminal AC(U) is connected between the high-side transistor 222*a* and the low-side transistor 224*a*, an output terminal AC(V) is connected between the high-side transistor 222*b* and the low-side transistor 224*b*, and an output terminal AC (W) is connected between the high-side transistor 222*c* and the low-side transistor 224*c*.

For example, in a case where the first terminal plate 90 is electrically connected to the first emitter electrode 27*a* of the first semiconductor chip 26 and the second terminal plate 92 is electrically connected to the first collector electrode 27*b* of the first semiconductor chip 26, or in a case where the first terminal plate 90 is electrically connected to the first collector electrode 27*b* of the first semiconductor chip 26 and the second terminal plate 92 is electrically connected to the first emitter electrode 27*a* of the first semiconductor chip 26, the power converted by the first semiconductor chip 26 can be used by being connected to a load or the like provided outside the casing 84 by using the first terminal plate 90 and the second terminal plate 92. Thus, the first terminal plate 90 and the second terminal plate 92 may function as main terminal plates serving as the output terminals AC.

In addition, for example, in a case where the first terminal plate 90 is electrically connected to the first gate electrode 27*c* of the first semiconductor chip 26 and the second terminal plate 92 is electrically connected to the first emitter electrode 27*a* or the first collector electrode 27*b* of the first semiconductor chip 26, the other end of the first terminal plate 90 is connected to a gate drive circuit (not illustrated). Then, the first semiconductor chip 26 is controlled according to signals generated by the gate drive circuit. Thus, the first terminal plate 90 may also function as a signal terminal.

In addition, for example, in a case where the first terminal plate 90 is electrically connected to the first emitter electrode 27*a* or the first collector electrode 27*b* of the first semiconductor chip 26, or in a case where the second terminal plate 92 is electrically connected to the first gate electrode 27*c* of the first semiconductor chip 26, the other end of the second terminal plate 92 is connected to the gate drive circuit (not illustrated). Then, the first semiconductor chip 26 is controlled according to the signals generated by the gate drive circuit. Thus, the second terminal plate 92 may also function as a signal terminal.

For example, in a case where the third terminal plate 94 is electrically connected to the second emitter electrode 29*a* or the second collector electrode 29*b* of the second semiconductor chip 28, the power converted by the second semiconductor chip 28 can be used by being connected to a load or the like provided outside the casing 84 by using the third terminal plate 94. Thus, the third terminal plate 94 may function as a main terminal plates serving as an output terminal AC.

For example, in a case where the third terminal plate 94 is electrically connected to the second gate electrode 29*c* of the second semiconductor chip 28, the other end of the third terminal plate 94 is connected to the gate drive circuit (not illustrated). Then, the second semiconductor chip 28 is controlled according to the signals generated by the gate drive circuit. Thus, the third terminal plate 94 may also function as a signal terminal.

The first adhesive layer 60 is provided on the first surface 90*a* of the first terminal plate 90. An adhesive layer made of a tape material using, for example, a polyimide film can be preferably used as the first adhesive layer 60. For example, the tape material using a polyimide film provided with the adhesive layers on both surfaces thereof is used, the tape material is fixed to the first surface 90*a* by using the adhesive layer provided on one surface thereof, and the adhesive layer provided on the other surface can be used as the first adhesive layer 60. However, the first adhesive layer 60 is not limited thereto, but for example, a layer obtained by applying a predetermined adhesive on the first surface 90a may be used as the first adhesive layer 60.

Since a polyimide film can withstand heat in the reflow furnace to be described later, the polyimide film is preferably used. In addition, for example, a film using a polyether ether ketone (PEEK) material, a film using a polytetrafluoroethylene (PTFE) material, or the like can also be preferably used.

The first adhesive layer 60 contains a first adhesive. An acryl-based adhesive is preferably used as the first adhesive, but the first adhesive is not thereto. The first adhesive preferably contains no siloxane.

The second adhesive layer 62 is provided on the second surface 92a of the second terminal plate 92. An adhesive layer made of a tape material using, for example, a polyimide film can be preferably used as the second adhesive layer 62. For example, the tape material using a polyimide film provided with the adhesive layers on both surfaces thereof is used, the tape material is fixed to the second surface 92a by using the adhesive layer provided on one surface thereof, and the adhesive layer provided on the other surface can be used as the second adhesive layer 62. However, the second adhesive layer 62 is not limited thereto, but for example, a layer obtained by applying a predetermined adhesive on the second surface 92a may be used as the second adhesive layer 62.

The second adhesive layer 62 contains a second adhesive. An acryl-based adhesive is preferably used as the second adhesive, but the second adhesive is not limited thereto. The second adhesive preferably contains no siloxane.

The third adhesive layer 64 is provided on the third surface 94a of the third terminal plate 94. An adhesive layer made of a tape material using, for example, a polyimide can be preferably used as the third adhesive layer 64. For example, the tape material using a polyimide film provided with the adhesive layers on both surfaces thereof is used, the tape material is fixed to the third surface 94a by using the adhesive layer provided on one surface thereof, and the adhesive layer provided on the other surface can be used as the third adhesive layer 64. However, the third adhesive layer 64 is not limited thereto, but for example, a layer obtained by applying a predetermined adhesive on the third surface 94a may be used as the third adhesive layer 64.

The third adhesive layer 64 contains a third adhesive. An acryl-based adhesive is preferably used as the third adhesive, but the third adhesive is not limited thereto. The third adhesive preferably contains no siloxane.

The first metal piece 70, the second metal piece 72, and the third metal piece 74 are attached to the first adhesive layer 60, the second adhesive layer 62, and the third adhesive layer 64, respectively. The first metal piece 70, the second metal piece 72, and the third metal piece 74 contain a metal material contained in the first ultrasonic bonding portion 50, the second ultrasonic bonding portion 52, or the third ultrasonic bonding portion 54.

Figure 4:
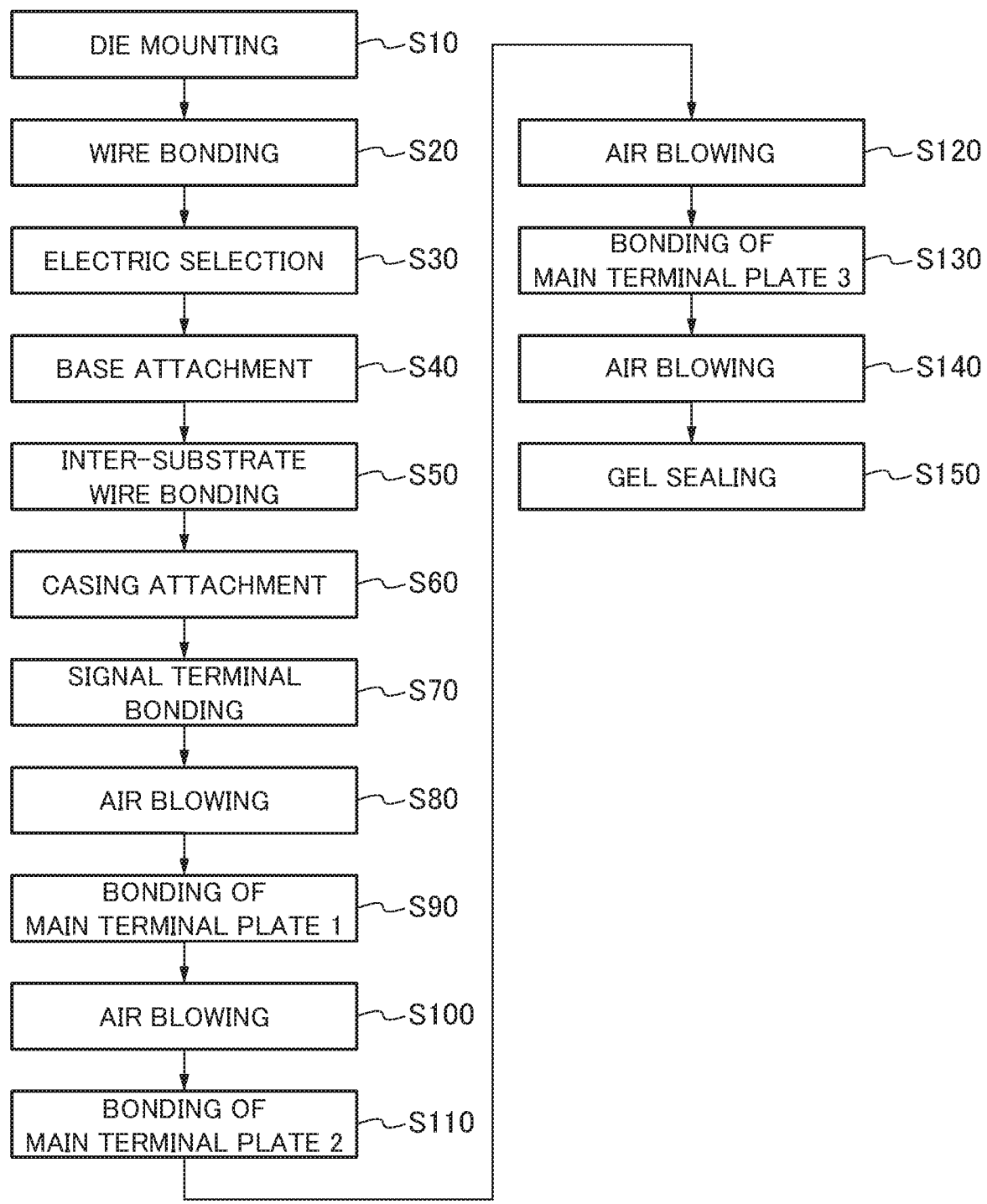
FIG. 4 is a flowchart illustrating a method of manufacturing the semiconductor device of the first embodiment.

FIG. 4 is a flowchart illustrating a method of manufacturing the semiconductor device 100 of this embodiment.

First, as "die mounting", the first insulating plate 12 where the fourth metal plate 22 and the third metal plate 20 are bonded is prepared. Next, the third metal plate 20 and the second semiconductor chip 28 are bonded by using the first bonding material 30. In addition, the second insulating plate 14 where the fifth metal plate 24, the first metal plate 16, and the second metal plate 18 are bonded is prepared. Next, the second metal plate 18 and the first semiconductor chip 26 are bonded by using the third bonding material 34. The bonding is performed, for example, in a known reflow furnace (S10).

Subsequently, as "wire bonding", the second semiconductor chip 28 and the third metal plate 20 are electrically connected by using the bonding wire 38a. In addition, the first semiconductor chip 26 and the second metal plate 18 are electrically connected by using the bonding wire 38b (S20).

Subsequently, as "electric selection", the testing of electrical characteristics of the first semiconductor chip 26 and the second semiconductor chip 28 is performed, by using, for example, a commercially available semiconductor tester (S30).

Subsequently, as "base attachment", the upper surface of the base material 2 and the fourth metal plate 22 are bonded by using the second bonding material 32. In addition, the upper surface of the base material 2 and the fifth metal plate 24 are bonded by using the fourth bonding material 36 (S40).

Subsequently, as "inter-substrate wire bonding", the first semiconductor chip 26 and the second semiconductor chip 28 are electrically connected by using a bonding wire (not illustrated) appropriately (S50).

Subsequently, as "casing attachment", the casing 84 is disposed on the base material 2 so as to surround the first semiconductor chip 26 and the second semiconductor chip 28. Then, the casing 84 is fixed on the base material 2 by using, for example, the screws 96 and the washers 98 (S60).

Subsequently, as "signal terminal bonding", for example, in a case where the first terminal plate 90 is electrically bonded to the first gate electrode 27c of the first semiconductor chip 26, the first ultrasonic bonding portion 50 is formed by bonding the first terminal plate 90 and the second metal plate 18 by using the ultrasonic bonding method. Accordingly, the first terminal plate 90 and the first gate electrode 27c of the first semiconductor chip 26 are electrically connected (S70).

Subsequently, as "air blowing", the metal pieces produced by bonding the first terminal plate 90 and the second metal plate 18 are removed by blowing air by using a commercially available air gun. In addition, at this time, the metal pieces produced by bonding the first terminal plate 90 and the second metal plate 18 may be removed by vibrating by using a commercially available vibrator or the like. In addition, blowing or vibrating of air described above may be performed with the orientation of the semiconductor device flipped during the manufacturing (S80).

Subsequently, as "bonding of a main terminal plate 1" (S90) and "air blowing" (S100), "bonding of a main terminal plate 2" (S110) and "air blowing" (S120), and "bonding of a main terminal plate 3" (S130) and "air blowing" (S140), by repeating the processes similar to the "signal terminal bonding" (S70) and the "air blowing" (S80), the second ultrasonic bonding portion 52 is formed by bonding the second terminal plate 92 and the first metal plate 16 by using the ultrasonic bonding method. In addition, the third ultrasonic bonding portion 54 is formed by bonding the third terminal plate 94 and the third metal plate 20 by using the ultrasonic bonding method.

Subsequently, as "gel sealing", the inside of the casing 84 is sealed by a sealing material (gel) 86. Then, the lid 88 is disposed on top of the sealing material 86 (S150). Accordingly, the semiconductor device 100 as a power module is obtained.

Hereinafter, functions and effects of the semiconductor device of this embodiment are described.

Figure 5:
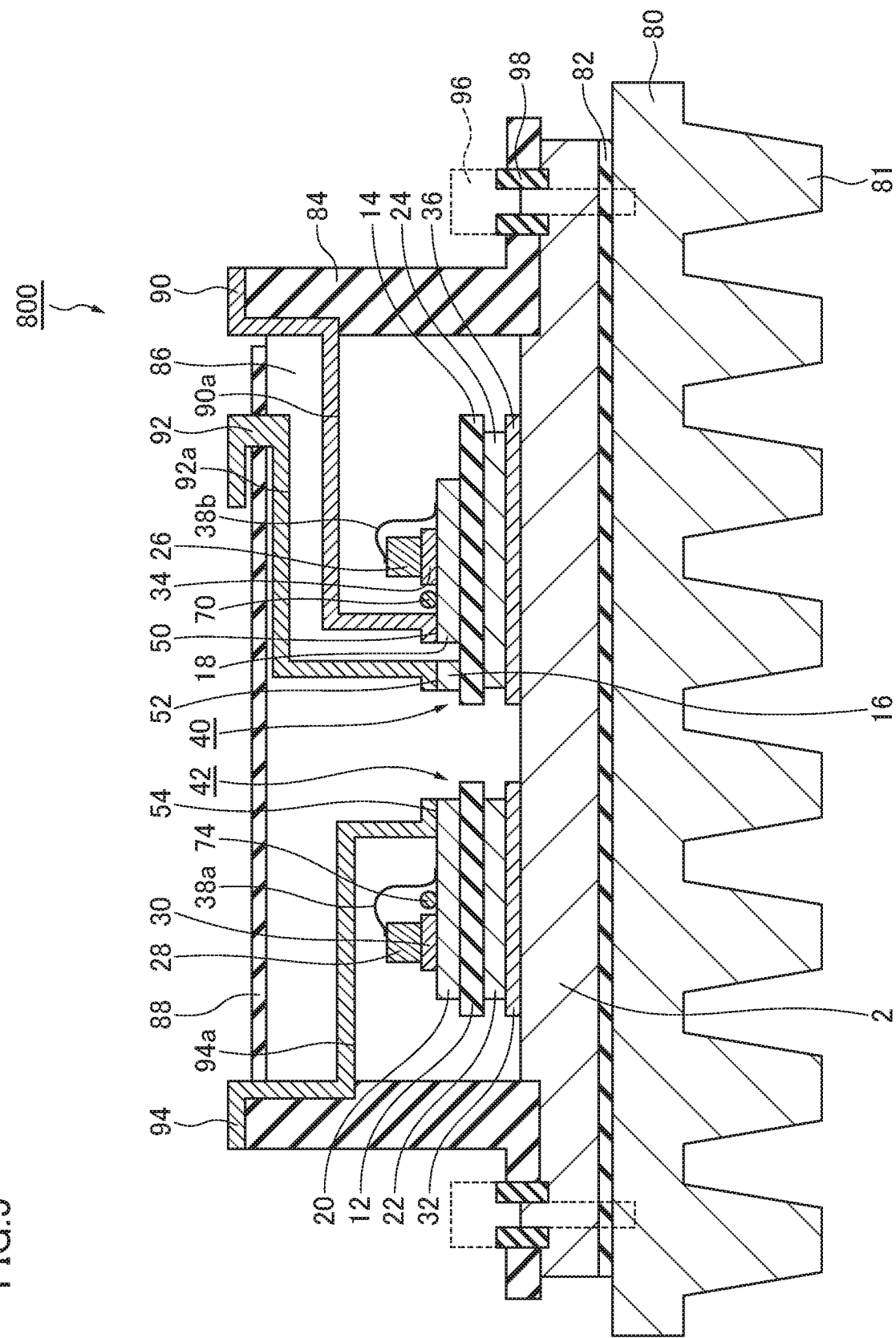
FIG. 5 is a schematic cross-sectional view of a semiconductor device as a comparative form of the first embodiment.

FIG. 5 is a schematic cross-sectional view of a semiconductor device 800 as a comparative embodiment of this embodiment. In the semiconductor device 800, the first adhesive layer 60, the second adhesive layer 62, and the third adhesive layer 64 are not provided.

The bonding of the terminal plate and the metal plate was performed by soldering previously. However, in a case where a large current flows as in the semiconductor device of this embodiment, and thus, the heat generation associated with the large current is large, the solder may be melted by the heat. Accordingly, by bonding the terminal plate and the metal plate by using the ultrasonic bonding method, the solder has been prevented from being melted by the heat.

However, in the case of using the ultrasonic bonding method, since the bonding is performed with rubbing the terminal plate and the metal plate with each other, debris contained in the terminal plate and the metal plate may occur as metal pieces. It cannot be known which portions of the semiconductor device theses metal pieces stay. For this reason, there has been a problem that leakage of a current flowing through the semiconductor device, short-circuit, or insulation failure may occur due to the metal pieces.

In addition, even in the case of performing "aid blowing", "vibration", or cleaning using a cleaning liquid such as water-based cleaning liquid in order to remove the metal pieces described above, there has been a problem that the metal pieces cannot be effectively removed. The number of semiconductor chips in the semiconductor device as described above may become as large as 50 or more. This is to maximize a current rating of the semiconductor device 100. However, as the number of semiconductor chips is increased, the number of terminal plates is also increased, and thus, the metal pieces are stuck to the terminal plates, so that it is difficult to remove the metal pieces. In particular, as illustrated in FIG. 1, in the case of such a structure where the first terminal plate 90 is covered with the second terminal plate 92 (provided above the second terminal plate 92), there is a problem that it is more difficult to remove the metal pieces.

Therefore, in the semiconductor device 100 of this embodiment, the first adhesive layer 60 is provided on the first surface 90a of the first terminal plate 90, and the first surface 90a faces the first semiconductor chip 26. In addition, the second adhesive layer 62 is provided on the second surface 92a of the second terminal plate 92 and the second surface 92a faces the first terminal plate 90. Furthermore, the third adhesive layer 64 is provided on the third surface 94a of the third terminal plate 94 and the third surface 94a faces the second semiconductor chip 28. Accordingly, the metal pieces are attached to the first adhesive layer 60, the second adhesive layer 62, and the third adhesive layer 64, so that it is possible to suppress leakage of a current flowing through the semiconductor device, short-circuit, or insulation failure. Accordingly, it is possible to provide a highly reliable semiconductor device.

Since an acryl-based adhesive has strong adhesion, the acryl-based adhesive is preferably used as the first adhesive, the second adhesive, and the third adhesive. On the other hand, the first adhesive, the second adhesive, and the third adhesive preferably contain no siloxane. This is because good adhesion is not to be performed.

According to the semiconductor device of this embodiment, it is possible to provide a highly reliable semiconductor device.

Second Embodiment

A semiconductor device of this embodiment is different from the semiconductor device of the first embodiment in that the substrate includes an insulating plate and a metal plate provided on the insulating plate, the semiconductor chip is provided above the metal plate, and the semiconductor device further includes a third adhesive layer containing a third adhesive provided on a portion of the metal plate where the semiconductor chip is not provided. Herein, description of contents overlapped with the first embodiment is omitted.

Figure 6:
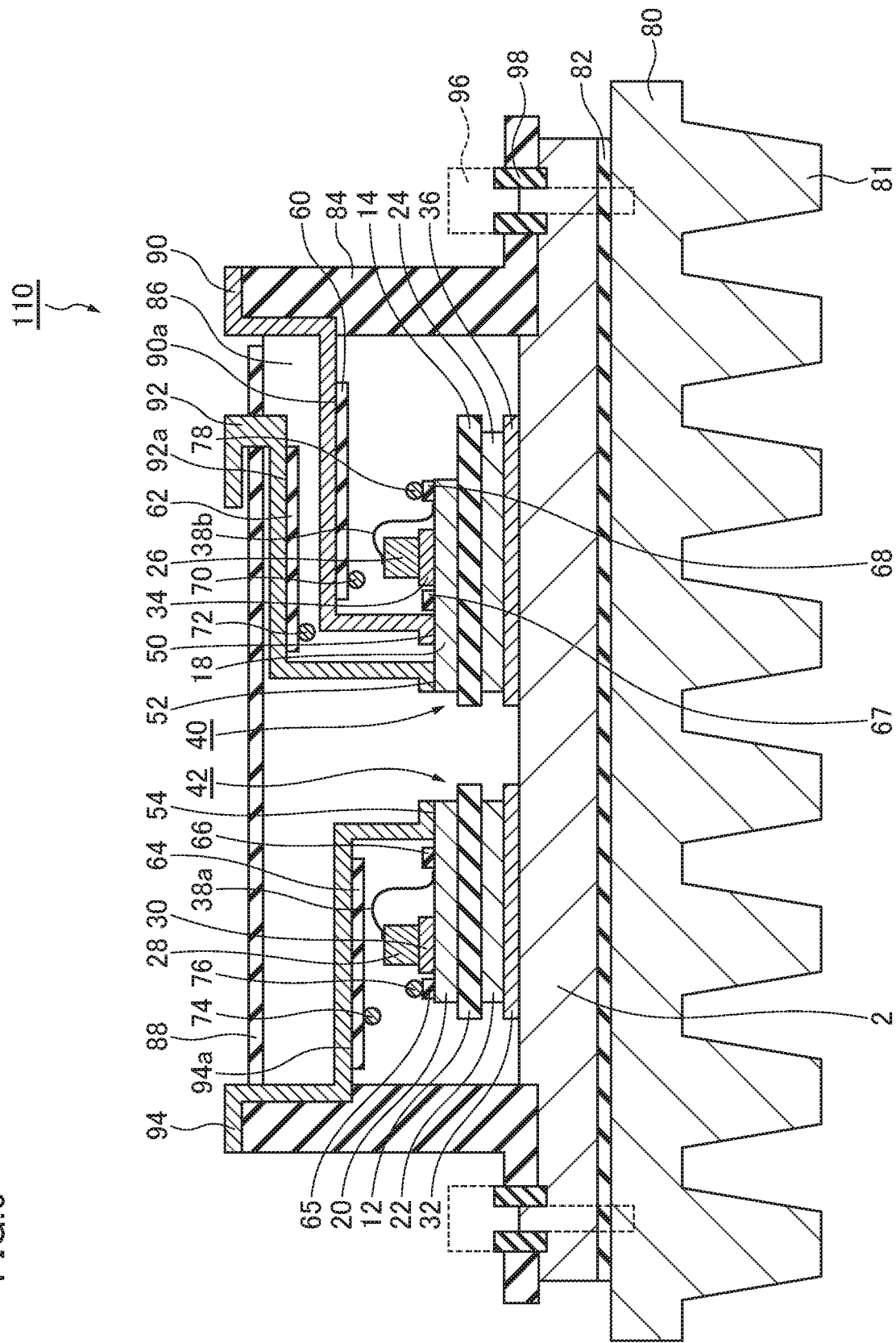
FIG. 6 is a schematic cross-sectional view of a semiconductor device of a second embodiment.

FIG. 6 is a schematic cross-sectional view of a semiconductor device 110 of this embodiment.

A fourth adhesive layer 65 containing a fourth adhesive and a fifth adhesive layer 66 containing a fifth adhesive are provided on the portion of the third metal plate 20 where the second semiconductor chip 28 is not provided.

In addition, the first semiconductor chip 26 (an example of the semiconductor chip) is provided on the second metal plate 18 (an example of the metal plate) on the second insulating plate 14 (an example of the insulating plate). Then, a sixth adhesive layer 67 (an example of the third adhesive layer) containing a sixth adhesive (an example of the third adhesive) and a seventh adhesive layer 68 containing a seventh adhesive are provided on the portion of the second metal plate 18 where the second semiconductor chap 28 is not provided.

The metal pieces produced by the ultrasonic bonding method are likely to fall and scatter on the side of the substrate (metal plate) rather than the side of the terminal plate due to gravity when the ultrasonic bonding is performed. Therefore, by providing an adhesive layer on a portion of the metal plate where the semiconductor chip is not provided, such metal pieces are attached, so that it is possible to allow the provision of a highly reliable semiconductor device.

Although several embodiments and examples have been described, these embodiments and examples have been presented as examples but have not been intended to limit the scope of the inventions. The novel embodiments described herein may be embodied in other various forms, and various omissions, substitutions, and modifications can be performed without departing from the spirit of the inventions. Such embodiments and modifications are included in the scope and spirit of the inventions and are included in the scope of the inventions disclosed in the claims and equivalents thereof.

While certain embodiments have been described, these embodiments have been presented by way of example only, and are not intended to limit the scope of the inventions. Indeed, SEMICONDUCTOR DEVICE described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device comprising:
   a substrate;
   a semiconductor chip provided above the substrate;
   a first ultrasonic bonding portion provided between the substrate and the semiconductor chip;
   a first terminal plate electrically connected to the semiconductor chip via the first ultrasonic bonding portion, the first ultrasonic bonding portion being provided on the substrate, and the first terminal plate having a first surface facing the semiconductor chip;
   a first adhesive layer provided on the first surface, and the first adhesive layer containing a first adhesive;

a second ultrasonic bonding portion provided on the substrate;

a second terminal plate electrically connected to the semiconductor chip via the second ultrasonic bonding portion, the second terminal plate being provided above the first terminal plate, and the second terminal plate having a second surface facing the first terminal plate; and a second adhesive layer provided on the second surface, and the second adhesive layer containing a second adhesive.

2. The semiconductor device according to claim 1, wherein the semiconductor chip has a first electrode, a second electrode, and a first control electrode, wherein the first terminal plate is electrically connected to the first electrode, and wherein the second terminal plate is electrically connected to the second electrode.

3. The semiconductor device according to claim 1, wherein the semiconductor chip has a first electrode, a second electrode, and a first control electrode, wherein the first terminal plate is electrically connected to the first control electrode, and wherein the second terminal plate is electrically connected to the first electrode or the second electrode.

4. The semiconductor device according to claim 1, wherein a first metal piece containing a first metal material is attached to the first adhesive layer, and wherein the first metal material is the same as a material contained in the first ultrasonic bonding portion.

5. The semiconductor device according to claim 1, wherein the first adhesive contains an acryl-based adhesive.

6. The semiconductor device according to claim 1, wherein the first adhesive contains no siloxane.

7. The semiconductor device according to claim 1, wherein the second adhesive contains an acryl-based adhesive.

8. The semiconductor device according to claim 1, wherein the second adhesive contains no siloxane.

9. The semiconductor device according to claim 1, wherein the substrate includes an insulating plate and a metal plate provided on the insulating plate, wherein the semiconductor chip is provided above the metal plate, and wherein the semiconductor device further comprises a third adhesive layer provided on a portion of the metal plate, the semiconductor chip not being provided on the portion of the metal plate, and the third adhesive layer containing a third adhesive.

10. The semiconductor device according to claim 9, wherein the third adhesive contains an acryl-based adhesive.

11. The semiconductor device according to claim 9, wherein the third adhesive contains no siloxane.

12. The semiconductor device according to claim 1, wherein a second metal piece containing a second metal material is attached to the second adhesive layer, and wherein the second metal material is the same as a material contained in the second ultrasonic bonding portion.

13. The semiconductor device according to claim 9, further comprising:

a third ultrasonic bonding portion provided on the substrate, wherein a third metal piece containing a third metal material is attached to the third adhesive layer, and wherein the third metal material is the same as a material contained in the third ultrasonic bonding portion.

* * * * *